United States Patent
Ishikawa

(10) Patent No.: US 9,454,475 B2
(45) Date of Patent: Sep. 27, 2016

(54) CONTROL DEVICE, STORAGE DEVICE, AND DATA WRITING METHOD

(71) Applicant: Sony Corporation, Tokyo (JP)

(72) Inventor: Yuya Ishikawa, Tokyo (JP)

(73) Assignee: Sony Corporation, Tokyo (JP)

( * ) Notice: Subject to any disclaimer, the term of this patent is extended or adjusted under 35 U.S.C. 154(b) by 748 days.

(21) Appl. No.: 13/870,722

(22) Filed: Apr. 25, 2013

(65) Prior Publication Data

US 2013/0304971 A1 Nov. 14, 2013

(30) Foreign Application Priority Data

May 8, 2012 (JP) ................................. 2012-106830

(51) Int. Cl.
| | |
|---|---|
| G06F 12/00 | (2006.01) |
| G06F 12/02 | (2006.01) |
| G11C 11/56 | (2006.01) |
| G11C 16/26 | (2006.01) |

(52) U.S. Cl.
CPC ....... *G06F 12/0246* (2013.01); *G11C 11/5642* (2013.01); *G11C 16/26* (2013.01); *G06F 2212/7202* (2013.01); *G06F 2212/7207* (2013.01)

(58) Field of Classification Search
USPC .......................................................... 711/103
See application file for complete search history.

(56) References Cited

U.S. PATENT DOCUMENTS

2010/0205357 A1* 8/2010 Mukaida ............. G06F 12/0246
711/103

FOREIGN PATENT DOCUMENTS

| JP | 2007-058840 | 3/2007 |
|---|---|---|
| JP | 2007-094921 | 4/2007 |
| JP | 2007-193838 | 8/2007 |
| JP | 2007-334852 | 12/2007 |
| JP | 2009-070098 | 4/2009 |
| JP | 2010-198407 | 9/2010 |

* cited by examiner

*Primary Examiner* — Jared Rutz
*Assistant Examiner* — Hamdy S Ahmed
(74) *Attorney, Agent, or Firm* — Chip Law Group

(57) ABSTRACT

A control device includes a control unit that performs a writing control of supplied host data, according to a data writing request from a host apparatus, with respect to a non-volatile memory where multi-value storage with 2 bits or more is performed in one memory cell, having a lower level page and an upper level page for at least the multi-value storage as a physical page in which a physical address is set, and where data writing is performed using each physical page in an order of physical addresses, and that causes the data writing to be performed until the physical page immediately before the lower level page, such that the data writing according to a next data writing request is started from the lower level page.

13 Claims, 15 Drawing Sheets

FIG. 2

| | PP0 | PP1 | PP2 | ... | PP13 | PP14 | PP15 |
|---|---|---|---|---|---|---|---|
| PB0 | | | | | | | |
| PB1 | | | | | | | |
| ... | | | | | | | |
| PB(n-1) | | | | | | | |
| PBn | | | | | | | |

FIG. 5A

| PHYSICAL PAGE → | PP0 | PP1 | PP2 | PP3 | PP4 | PP5 | PP6 | PP7 | PP8 | PP9 | PP10 | PP11 | PP12 | PP13 | PP14 | PP15 |
|---|---|---|---|---|---|---|---|---|---|---|---|---|---|---|---|---|
| PHYSICAL BLOCK (PB) | [Lower] | [Lower] | [Lower] | [Lower] | [Upper] | [Upper] | [Lower] | [Lower] | [Upper] | [Upper] | [Lower] | [Lower] | [Upper] | [Upper] | [Lower] | [Lower] |

FIG. 5B

| PHYSICAL PAGE → | PP0 | PP1 | PP2 | PP3 | PP4 | PP5 | PP6 | PP7 | PP8 | PP9 | PP10 | PP11 | PP12 | PP13 | PP14 | PP15 |
|---|---|---|---|---|---|---|---|---|---|---|---|---|---|---|---|---|
| PHYSICAL BLOCK (PB) | [Lower] | [Middle] | [Lower] | [Lower] | [Middle] | [Upper] | [Lower] | [Middle] | [Upper] | [Lower] | [Middle] | [Upper] | [Lower] | [Middle] | [Upper] | [Lower] |

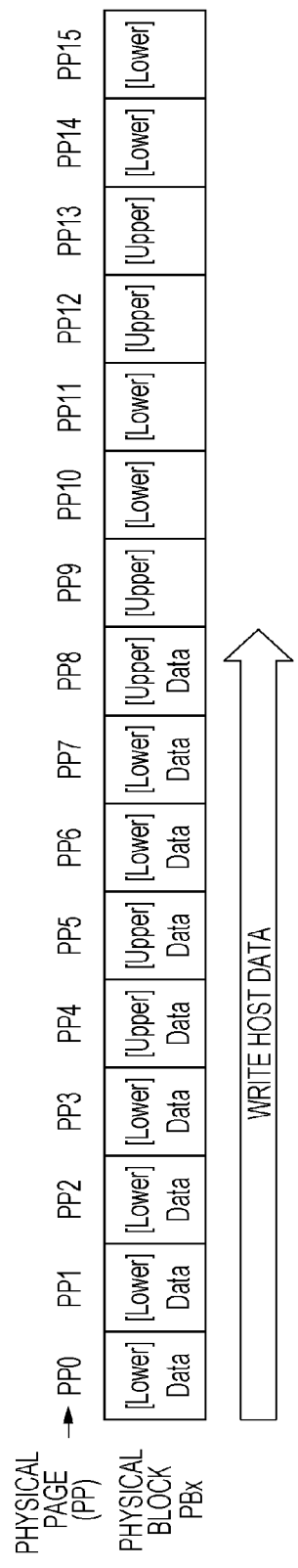
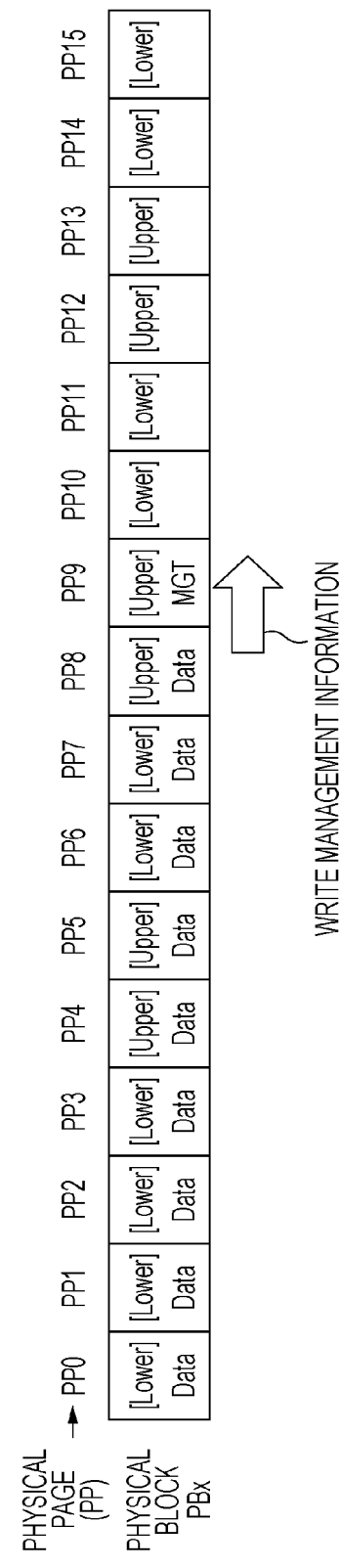

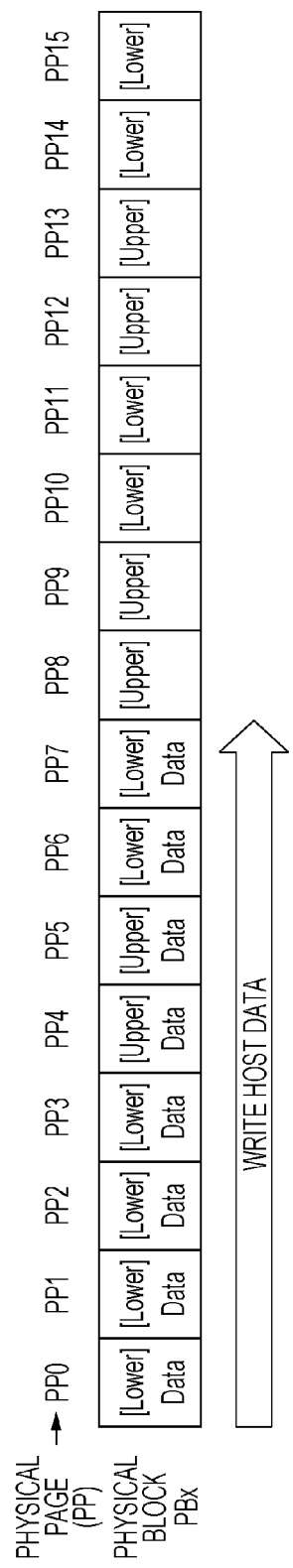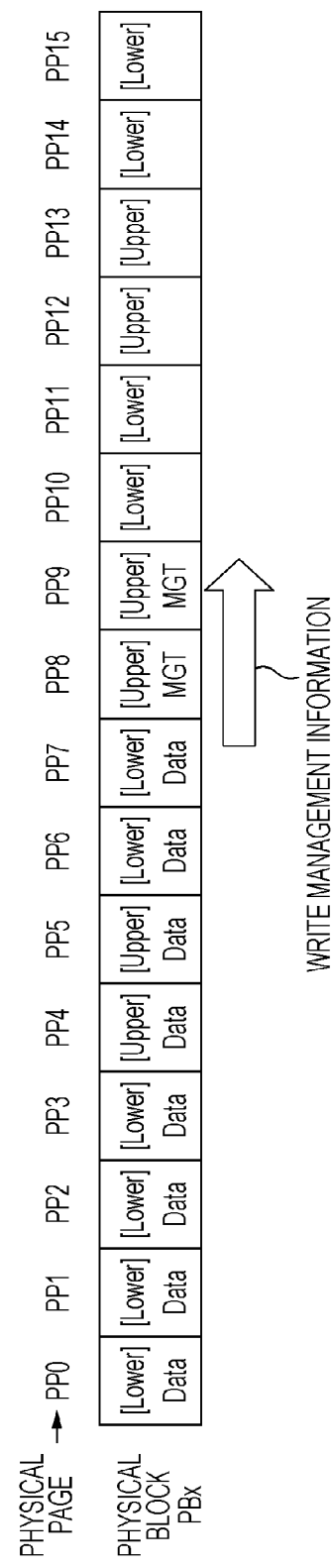

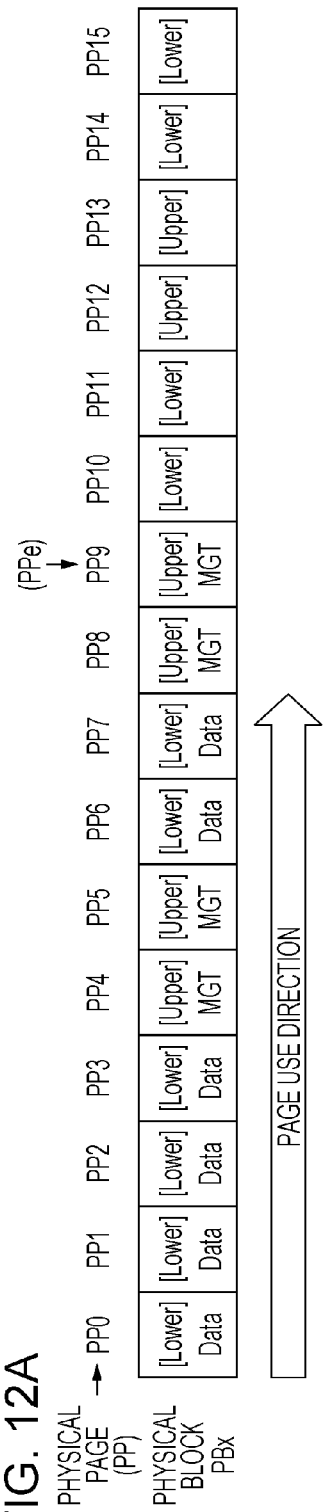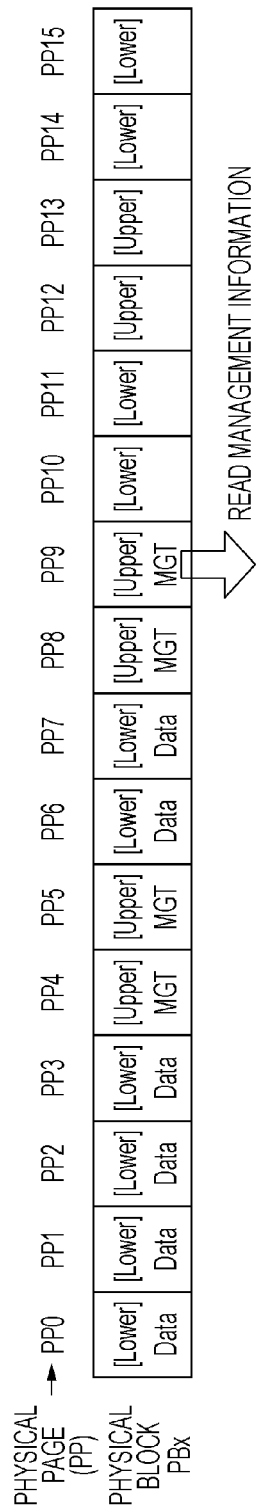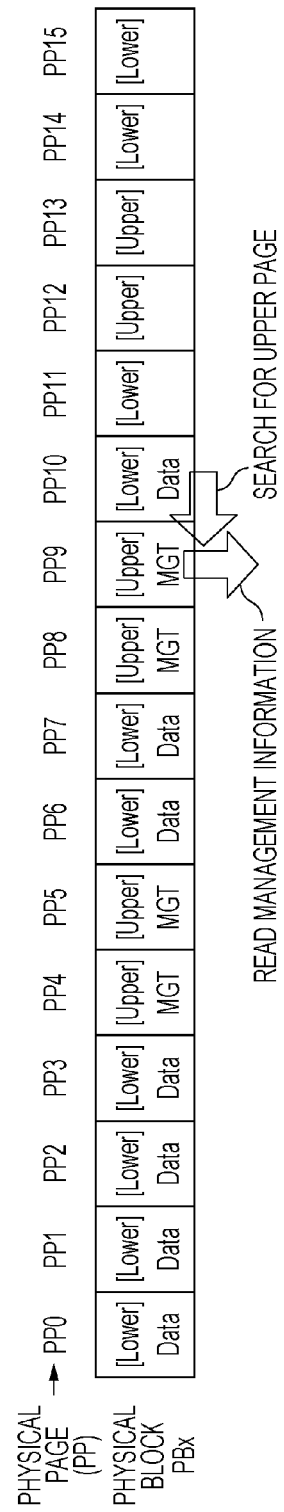

FIG. 14A

| LBA | PHYSICAL PAGE |
|---|---|
| 1 | 1 |
| 9 | 6 |
| 100 | 7 |
| 1000 | 2 |
| 3000 | 3 |
| 3004 | 4 |
| 3008 | 5 |

FIG. 14B

| LBA | PHYSICAL PAGE | PHYSICAL BLOCK |
|---|---|---|
| 1 | 1 | X |
| 9 | 6 | X |
| 100 | 7 | X |
| 1000 | 2 | X |
| 3000 | 3 | X |
| 3004 | 4 | X |
| 3008 | 5 | X |

FIG. 14C

| LBA | PHYSICAL PAGE |
|---|---|
| 1 | 1 |
| 5 | 10 |
| 9 | 6 |
| 100 | 7 |
| 1000 | 2 |
| 3000 | 3 |
| 3004 | 4 |
| 3008 | 5 |

CONTROL DEVICE, STORAGE DEVICE, AND DATA WRITING METHOD

CROSS REFERENCES TO RELATED APPLICATIONS

The present application claims priority to Japanese Priority Patent Application JP 2012-106830 filed in the Japan Patent Office on May 8, 2012, the entire content of which is hereby incorporated by reference.

BACKGROUND

The present disclosure relates to a control device, a storage device, and a data writing method, and particularly to a writing control with respect to a non-volatile memory performing multi-value storage with 2 bits or more in a memory cell.

For example, a storage device using a non-volatile memory such as a NAND type flash memory is widely used. The non-volatile memory is used for a memory card, a solid state drive (SSD), an embedded multimedia card (eMMC) and the like which are used for various electronic apparatuses, information processing apparatuses or the like, for example.

Japanese Unexamined Patent Application Publication Nos. 2009-70098, 2007-334852, 2007-193838, and 2007-58840 disclose the storage devices using the flash memory.

In addition, for example, it is known that the NAND type flash memory or the like includes a single level cell (SLC) which determines a storage amount of electrons (charge amount) within a floating gate of one cell using one threshold value and thus stores one bit of information, and additionally includes a multi level cell (MLC) which determines a charge amount difference using multi-values with 4 pieces or more and thus stores two or more bits of information.

In addition, there is also a case where a cell storing 2 bits is particularly indicated by the MLC in a narrow sense, and a cell storing 3 bits is called a triple level cell (TLC).

Japanese Unexamined Patent Application Publication Nos. 2010-198407 and 2007-94921 disclose a multi-value flash memory which stores multiple bit data in one cell.

A physical block address (PBA: Physical Address) is used as an address of a physical storage area in such a NAND type flash memory or the like. Therefore, a physical block, a physical page, and a physical sector are set. The physical page is configured to have multiple physical sectors, and the physical block is configured to have multiple physical pages.

Erasing can be performed by a physical block unit, and writing (programming) and reading can be performed by a physical page unit.

For an address designation from a host side or a memory control unit side, a logical block address (LBA: Logical Address) is used. A logical block and a logical page which use the logical address, are associated with a physical address. Therefore, when there is an access request, the logical address is converted into the physical address, and an access to an actual flash memory is performed.

In a case of the multi-value NAND type flash memory, an upper level page and a lower level page are set as the physical page in which the physical address is provided.

For example, in a case of the MLC storing 2 bits, a lower page is set as the lower level page, and an upper page is set as the upper level page.

In a case of the TLC storing 3 bits, the lower page is set as the lower level page, a Middle Page is set as a middle level page, and the upper page is set as the upper level page.

SUMMARY

A memory device using a multi-value NAND type flash memory as a storage device uses a lower page with a high writing speed, and thus it is possible to achieve a high access speed.

However, when using the lower page only, the flash memory is able to use only a half of an area in case of an MLC, and one third of an area in case of a TLC.

Furthermore, in recent years, the multi-value NAND type flash memory is not allowed to use the lower page only, and has a restriction in which writing has to be performed on a physical page which may cause damage to physical page data sharing a physical cell which has a low speed with a middle page or an upper page.

In addition, as a recent trend of a host device, an access to a small size such as a physical page size or a smaller size is increasing. At this time, if writing is performed in the middle page or the upper page, the writing from a host apparatus become extremely slow, whereby causing a degraded performance of the host device.

It is desirable to improve a system performance through host data writing, with a high speed, on a non-volatile memory performing a multi-value storage.

According to an embodiment of the present disclosure, there is provided a control unit that performs a writing control of supplied host data, according to a data writing request from a host apparatus, with respect to a non-volatile memory where multi-value storage with 2 bits or more is performed in one memory cell, having a lower level page and an upper level page for at least the multi-value storage as a physical page in which a physical address is set, and where data writing is performed using each physical page in an order of physical addresses, and that causes the data writing to be performed until the physical page immediately before the lower level page, such that the data writing according to a next data writing request is started from the lower level page.

According to a storage device of another embodiment of the present disclosure, there is provided the control device and the above-described non-volatile memory.

According to an embodiment of the present disclosure, there is provided a data writing method performing a writing of supplied host data, according to a data writing request from a host apparatus, with respect to the non-volatile memory, and performing data writing until a physical page immediately before the lower level page, such that the data writing according to a next data writing request is started from the lower level page.

In a technology of the present disclosure described above, in a case where a certain data writing request is made, host data writing is performed, but non-host data writing is also performed when necessary, and thereby data writing according to a next writing request is started from a lower page. Accordingly, for example, in host data with a small size, there are many cases where the data writing may be completed only on the lower page.

According to the present disclosure, when the host data is written to the non-volatile memory according to the data writing request, the writing is started from the lower level page. High speed writing of the host data is achieved by using the lower level page with a high writing speed. In particular, it is effective when there are frequent writing requests for writing the data with a small size from the host apparatus.

Additional features and advantages are described herein, and will be apparent from the following Detailed Description and the figures.

BRIEF DESCRIPTION OF THE FIGURES

FIG. 2 is an explanatory diagram of physical blocks and physical pages in a non-volatile memory according to the embodiment;

FIGS. 5A and 5B are explanatory diagrams of physical pages according to the embodiment;

FIGS. 8A and 8B are explanatory diagrams of operation examples when writing host data and management information according to the embodiment;

FIGS. 9A and 9B are other explanatory diagrams of operation examples when writing host data and management information according to the embodiment;

FIGS. 12A to 12C are explanatory diagrams of a management information reading operation according to the embodiment;

FIGS. 14A to 14C are explanatory diagrams of logical and physical address conversion tables according to the embodiment.

DETAILED DESCRIPTION

Figure 1:
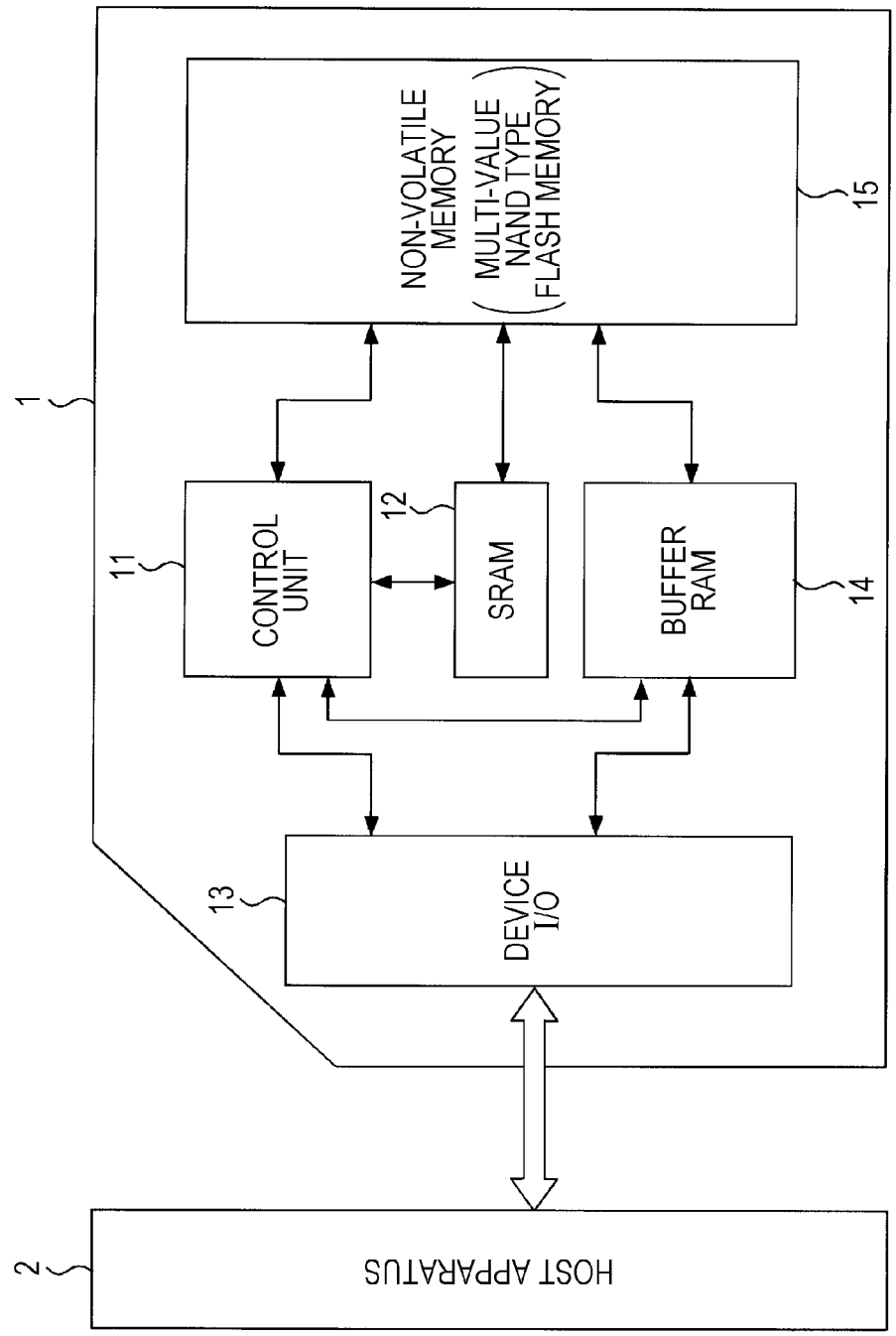
FIG. 1 is a block diagram of a memory card according to an embodiment of the present disclosure.

Hereinafter, an embodiment will be described in the following order. In addition, a memory card 1 described in the embodiment is an embodiment of a storage device described in claims. In addition, a control unit 11 within the memory card 1 is an embodiment of a control device described in claims, and a data writing method performed by a control of the control unit 11 is an embodiment of a data writing method described in claims.
1. Memory Card Configuration
2. MLC/TLC
3. Data Writing Control Process
4. Management Information Reading Process
5. Application Example of Logical and Physical Address Conversion Table
6. Modification Example
    1. Memory Card Configuration FIG. 1 illustrates a configuration example of the memory card 1 according to the embodiment.

The memory card 1 is connected to a host apparatus 2, and used as a storage device. For example, the host apparatus 2 includes information terminals such as a personal computer, a digital still camera, a video camera, an audio player, a video player, a game machine, a cellular phone, or a PDA (Personal Digital Assistant), various electronic apparatuses, and information processing apparatuses.

The memory card 1 includes the control unit 11, an internal RAM (Random Access Memory) 12, a device interface 13, a buffer RAM 14, and a non-volatile memory 15.

The control unit 11 is configured to have a CPU (Central Processing Unit), and controls the whole memory card 1. Therefore, the control unit 11 sequentially performs command coding assigned in the internal RAM 12. The control unit 11 mainly performs reading or writing data according to a command from the host apparatus 2. Therefore, the control unit 11 performs a control of data transmission and reception operation between the device interface 13 and the host apparatus 2, a control of writing/reading operation of the buffer RAM 14, and a control of an access operation to the non-volatile memory 15.

The internal RAM 12 is configured to have a SRAM (Static Random Access Memory), for example. The internal RAM 12 is used as a storage or a work area of a program (a firmware) performed by the control unit 11.

The device interface 13 performs a communication with the host apparatus 2.

The buffer RAM 14 is used for buffering data (writing data or reading data) transmitted to and from the host apparatus 2.

The non-volatile memory 15 is a multi-value NAND type flash memory, for example.

That is, in a case of the present embodiment, the non-volatile memory 15 in which multi-value storage with 2 bits or more is performed in one memory cell, has a lower level page (lower page) and an upper level page (upper page) for at least multi-value storage as a physical page in which a physical address is set. Then each physical page is used in an order of physical addresses, thereby configuring the multi-value NAND type flash memory in which data writing is performed.

As a basic operation of the memory card 1, when writing the data, the memory card 1 receives a writing request, a writing address (a logical address), a data size, and further data to be written, from the host apparatus 2.

The data to be written which is transmitted from the host apparatus 2 is received by the device interface 13 and buffered by the buffer RAM 14. Then data is written to the non-volatile memory 15 under the control of the control unit 11. The control unit 11 controls such operations according to the writing request, the writing address, and the data size.

When reading the data, a reading request, a reading address (a logical address), and a data size are transmitted from the host apparatus 2. The control unit 11 performs data reading instructed from the non-volatile memory 15, based on the reading address and the data size, and causes the data to be buffered in the buffer RAM 14. In addition, the control unit 11 performs an error correction process or the like with respect to the data which buffered and read. Then the read data is transmitted from the buffer RAM 14 to the device interface 13, and transmitted to the host apparatus 2.

As described above, the non-volatile memory 15 uses the physical address as an address of a physical storage area. As a result, the physical block, the physical page, and the physical sector are set. The physical page is configured to have multiple physical sectors, and in addition, the physical block is configured to have the multiple physical pages.

Figure 2:
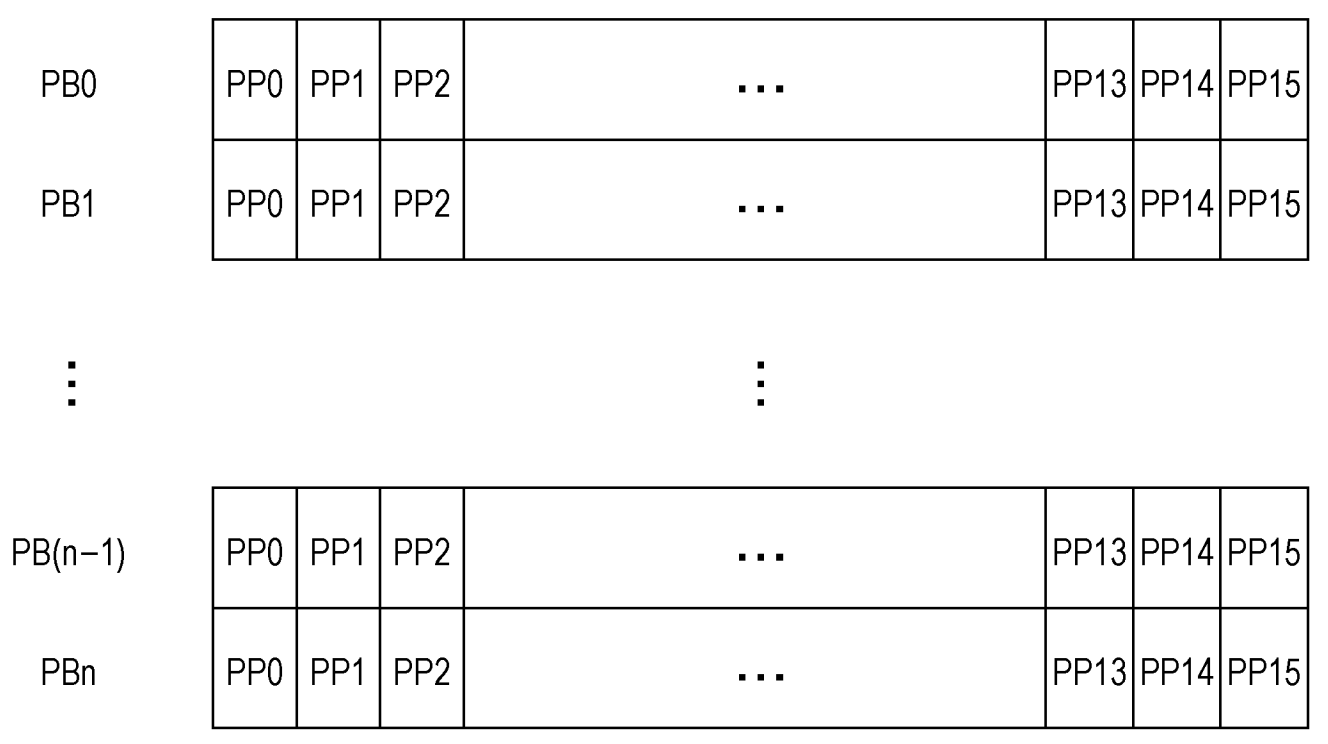

FIG. 2 schematically illustrates n+1 pieces of physical blocks PB0 to PBn as a physical block PB. In FIG. 2, 16 physical pages PP (PP0 to PP15) are illustrated in the physical block PB. In addition, one piece of the physical block PB is not limited to 16 piece configuration of physical pages PP, and furthermore may be a configuration with more than 16 physical pages. FIG. 2 may be considered as a portion of the physical block PB.

One sheet of the physical pages PP is formed from 16 KB or the like, for example. Inside of the physical page PP is divided into multiple physical sectors, which is not illustrated.

In addition, a lower page and an upper page are allocated as each physical page to the non-volatile memory 15 configured by the multi-value NAND type flash memory according to the present example.

Erasing is performed by a physical block unit, and writing (programming) and reading can be performed by a physical page unit. That is, the physical block is a physical erasing unit, and the physical page is a physical writing unit.

The address designation from the host apparatus 2 uses a logical address. A logical block, a logical page, and a logical sector which use the logical address are associated with the physical address. That is, the control unit 11 forms a logical and physical address conversion table associated with the logical address and the physical address, and when there is an access request from the host apparatus 2, translates the designated logical address into the physical address with reference to the logical and physical address conversion table. Then an access to an actual non-volatile memory 15 is performed by the physical address.

In the case of the present embodiment, the control unit 11 performs a generation and an update of the logical and physical address conversion table showing a correspondence between the logical address and the physical address.

In addition, the logical and physical address conversion table which the control unit 11 generates and updates is stored in the internal RAM 12, under a management of the control unit 11, for example.

In addition, in the present embodiment, the data having discontinuous logical addresses is allowed to be written to continuous physical pages PP in the physical block PB.

In addition, the data (the host apparatus 2 manages the data using the logical address) which has to be written or read to or from the host apparatus 2 is referred to as "host data".

In addition, in the present embodiment, with respect to the non-volatile memory 15 as the multi-value NAND type flash memory, the control unit 11 performs a writing control of the supplied host data according to a data writing request from the host apparatus 2. But in this case, the control unit 11 performs a control to perform the data writing until the physical page immediately before the lower page, so that the host data writing according to next data writing request may be started from the lower page.

Therefore, in the present example, in a case where the host data writing corresponding to the data writing request does not reach the physical page immediately before the lower page, the control unit 11 performs non-host data writing until the physical page immediately before the lower page. The non-host data is, for example, management information used by the control unit 11, such as the above-described logical and physical address conversion table.

In addition, the management information is not limited to the logical and physical address conversion table, for example, the host data is copyright information when the host data is copyright content, or error information showing the physical address with error occurred in the non-volatile memory 15, and various examples are considered. The management information may be production information of the memory card 1, information on a serial number, and usage history information or the like.

In addition, a meaning of the host data is not limited to the management information, and indicates the data except for the host data that is the data writing request from the host apparatus 2.

2. MLC/TLC

Here, the multi-value NAND type flash memory which is called MLC and TLC will be described.

Figure 3:
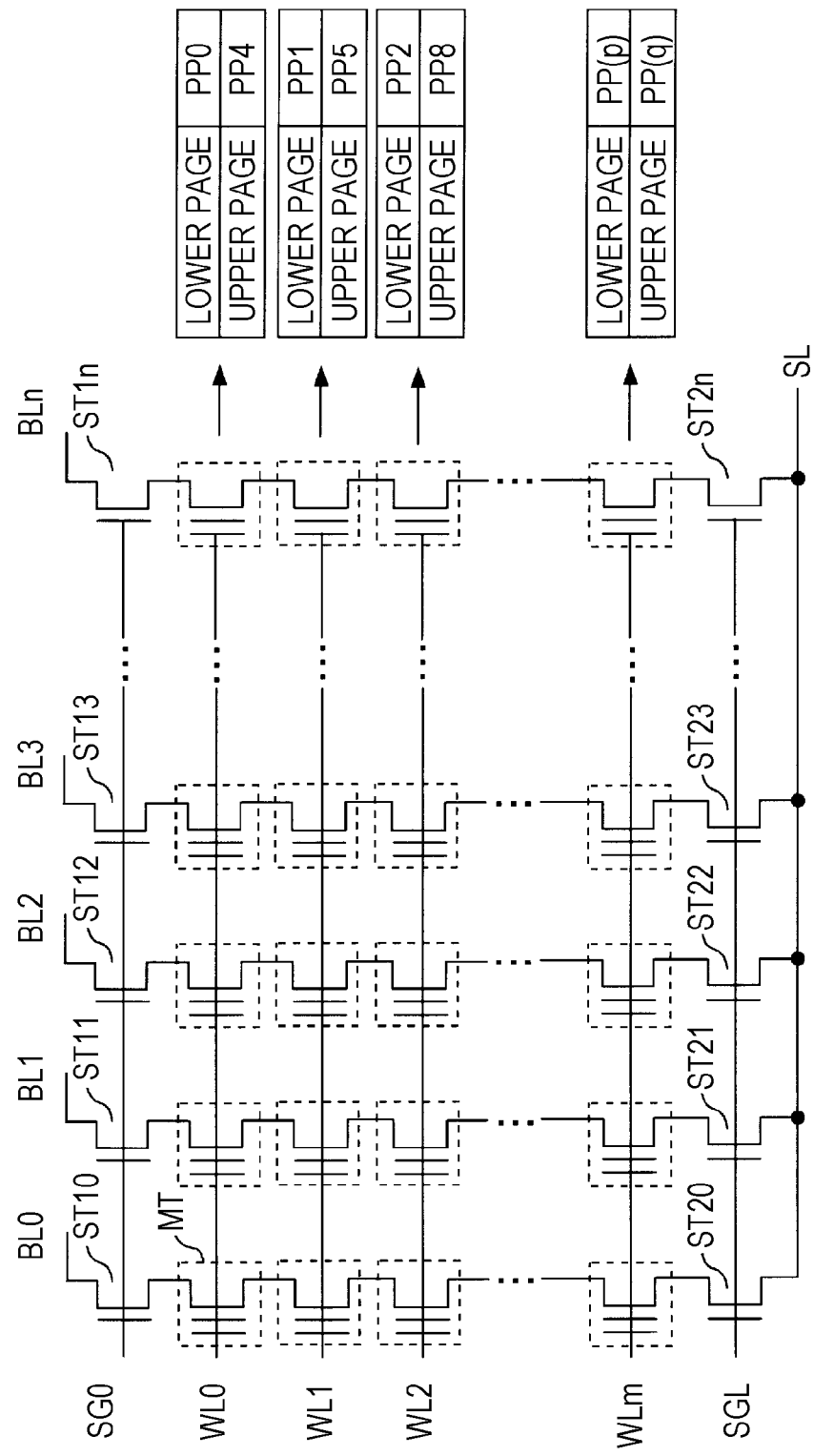
FIG. 3 is an explanatory diagram of a multi-value NAND type flash memory according to the embodiment.

FIG. 3 illustrates an internal configuration of the multi-value NAND type flash memory as the non-volatile memory 15 according to the embodiment.

As illustrated in FIG. 3, the multi-value NAND type flash memory configures a memory cell array in which a plurality of electrically rewritable memory cells MT are arranged in a matrix type.

The memory cells MT are connected in series, and both ends thereof are configured to be interposed between selection gate transistors ST. This configuration is called a NAND string. Here, each NAND string has a configuration in which m number of memory cells MT are connected in series.

An end of each NAND string is connected to bit lines BL0 to BLn via selection gate transistors ST10 to ST1$n$ which are connected to a selection gate line SGO in a drain side, and other end of each NAND string is connected to a common source line SL via selection gate transistors ST20 to ST2$n$ which are connected to a selection gate line SGL in a source side. The NAND columns are connected to column bit lines BL0 to BLn, and control gates of each memory cell MT are connected to word lines WL0 to WLn.

The multiple memory cells MT connected to the same word lines WL0 to WLm are called a page. The page configures one sheet of physical page by gathering multiple memory cells MT, in a case of a single level cell (SLC).

The memory cells MT according to the present disclosure include multi-value cells which are capable of storing multi bit data, and the page becomes page numbers corresponding to their bit numbers. FIG. 3 illustrates the memory cells MT which are capable of storing 2 bit data, and the multiple memory cells MT are divided into 2 physical pages. This correspondence is illustrated on the right side in FIG. 3.

That is, there are a lower page and an upper page for each of word lines WL0 to WLm.

Addresses (PP0 to PPq) are allocated to each lower page and each upper page as the physical pages PP. Here, the allocation of the address PP0 to PPq as the physical pages PP described in FIG. 3 is no more than an example.

The writing operation and the reading operation are performed by a page unit. The writing is performed in the order from the lower page to the upper page, and it is not possible to write in the order from the upper page to the lower page. If writing to the upper page is failed, content of the lower page can be destroyed (erased) in principle.

Figure 4:
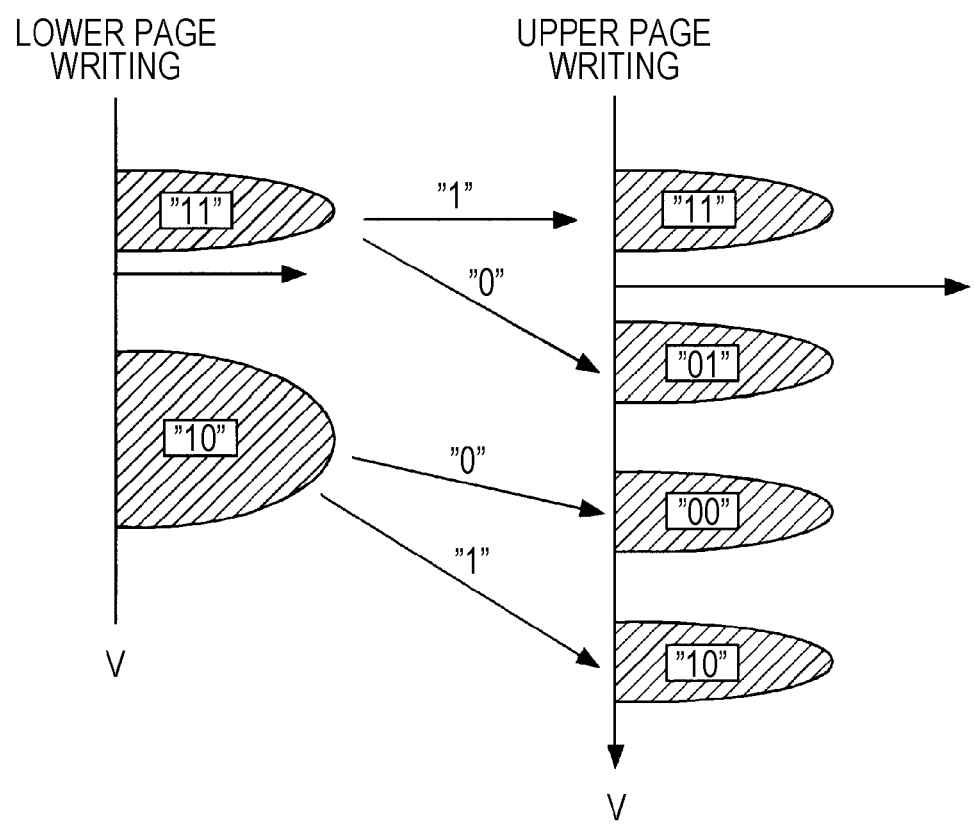
FIG. 4 is an explanatory diagram of a storage operation of the multi-value NAND type flash memory according to the embodiment.

The writing operation concept of the multi-value NAND type flash memory will be described with respect to FIG. 4. FIG. 4 schematically illustrates a threshold value distribution of 4 value data (2 bits) performing 2 bit storage in one memory cell MT.

As illustrated in FIG. 4, 2 page amounts of data per the memory cell MT can be stored. The writing is performed in the order from the lower page to the upper page.

The memory cell MT can hold any one of 4 value data "xy" which is defined by upper page data "x" and lower page data "y". The 4 value data "xy" can be allocated in the order of the threshold value voltages of the memory cell MT, for example, data "11", "01", "00", and "10".

The data "11" indicates that the threshold value voltage of the memory cell MT is in a negatively erased state. In addition, a data allocation rule is not limited to this. In addition, in the present embodiment, hereinafter, what one piece of memory cell MT can store 2 bit values is adopted to be described, but it may be a configuration where storage of more than 3 bits is performed in one piece of the memory cell MT.

In the lower page writing operation, the writing of data "10" is selectively performed with respect to the memory cell MT of the data "11" (the erased state) by the lower bit data "y".

In the upper page writing operation, the writing of the upper bit data "x" is selectively performed respectively with respect to the memory cell MT of data "11" and the memory cell MT of data "10", and the data "01" and "00" are written.

The threshold value distribution of data "10" before the upper page writing is positioned approximately in the middle of the threshold value distribution of the data "01" and "00" after the upper page writing, and generally has a wider threshold value distribution than that after the upper page writing.

That is, after the upper page writing, each value is identified by the three threshold values with respect to a charge amount.

In the multi-value NAND type flash memory, the time necessary for the upper page writing is long compared to the time necessary for the lower page writing. In order to process a charge amount transition described in FIG. 4, for example, the time necessary for the upper page writing can be approximately five times the time necessary for the lower page writing.

FIG. 5A illustrates an allocation example of the physical page addresses in MLC.

Here, the physical pages PP of a single physical block are illustrated, but the page addresses of "0", "1", "2" . . . are allocated in each physical page PP. Those are illustrated as "PP0", "PP1", . . . "PP15".

In each physical page, "Lower" indicates the lower page, and "Upper" indicates the upper page. In the example, the physical pages PP0 to PP3, PP6, PP7, PP10, PP11, PP14, and PP15 are the lower pages. In addition, the physical pages PP4, PP5, PP8, PP9, PP12, and PP13 are the upper pages.

In the physical block PB, the physical pages are used in the order of the page addresses, and thereby the data writing is performed. That is, the physical pages are used in the order of PP0, PP1, . . . PP15. For example, as illustrated in FIG. 3, the lower page and the upper page have a configuration in which the memory cells are commonly used for each of the word lines WL0 to WLm, but the physical page PP0 (the lower page) and the physical page PP4 (the upper page) have a configuration in which a memory cell of the same word line is commonly used. Then, the physical pages PP are used in the order of the page addresses in FIG. 5A, and thereby on a group of the lower pages and the upper pages, writing is performed on the lower page first.

FIG. 5B illustrates an allocation example of the physical page addresses in the TLC.

In each physical page, "Lower" indicates the lower page, "Middle" indicates a middle page, and "Upper" indicates the upper page. In the example, the physical pages PP0, PP1, PP3, PP6, PP9, PP12, and PP15 are the lower pages. In addition, the physical pages PP2, PP4, PP7, PP10, and PP13 are the middle pages. In addition, the physical pages PP5, PP8, PP11, and PP14 are the upper pages.

In the TLC, the lower pages, the middle pages, and the upper pages have a configuration in which the memory cell is commonly used, but the physical pages are set as illustrated in FIG. 5B, and thereby as for each memory cell, the writing operation is necessarily performed in the order of the lower pages, the middle pages, and the upper pages.

3. Data Writing Control Process

The control unit 11 according to the present embodiment performs the host data writing requested from the host apparatus 2 in the order of page addresses of the physical pages PP within the physical block illustrated in the above FIGS. 5A and 5B.

At this time, while the host data writing is continued in succession, the writing is performed not only on the lower pages, but also on the middle pages or the upper pages.

Then, in a case where the physical page next to the physical page, on which the host data writing is completed is the lower page, the process is finished at that time.

However, in a case where the page next to the page, on which the host data writing is completed is the lower page, the writing of the management information (for example, the logical and the physical address conversion table) is performed until the physical page before the next lower page, and it becomes that the next writing is started from the lower page, for example.

Figure 6:
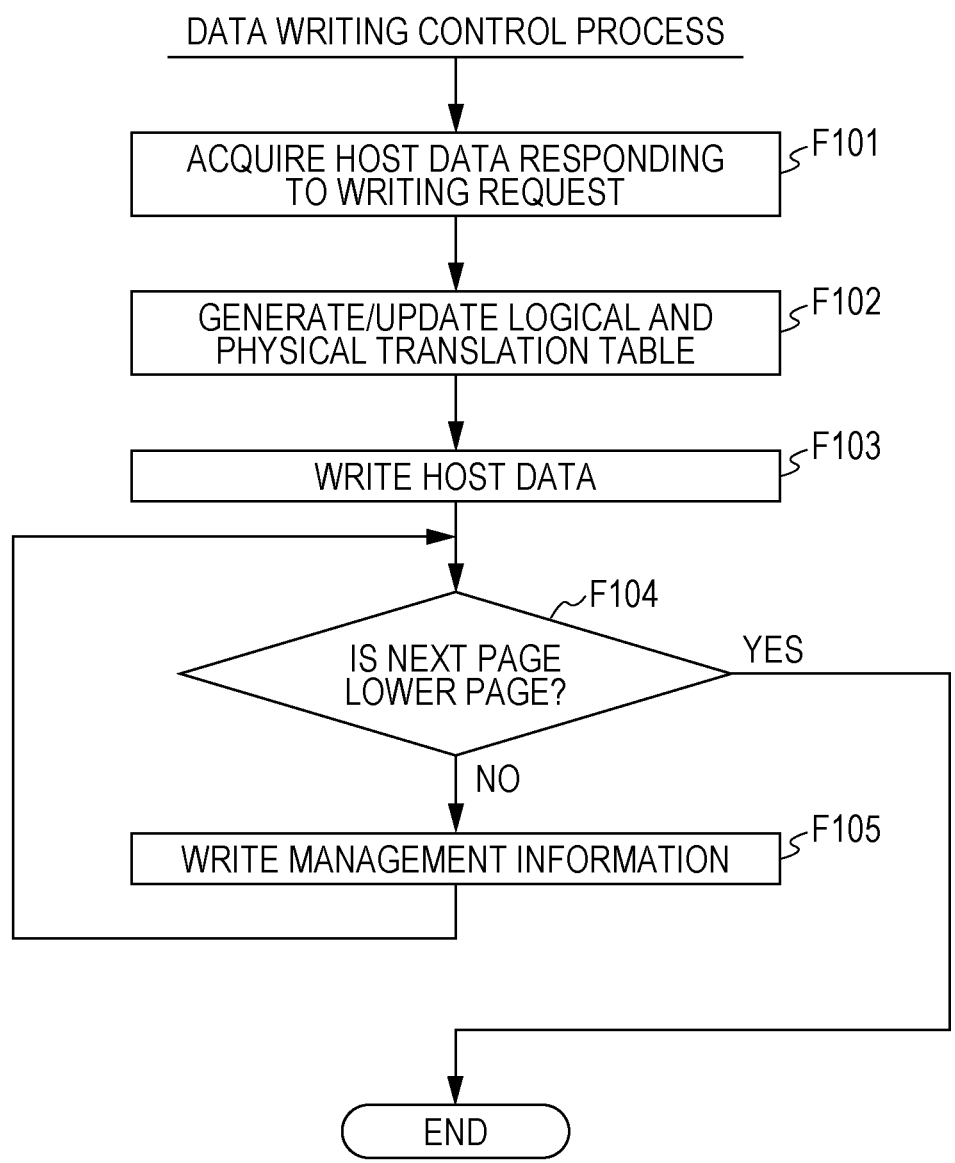
FIG. 6 is a flow chart of a process when writing data according to the embodiment.

FIG. 6 illustrates the writing control process using the control unit 11.

In step F101, the control unit 11 performs incorporation of the host data to be written to or obtainment of logical address to the data writing request from the host apparatus 2.

Specifically, the control unit 11 temporarily stores the transmitted host data in the buffer RAM 14 via the device interface 13. In addition, the control unit 11 grasps the logical address of the host data to be written and the data amount using the writing request command transmitted via the device interface 13.

In step F102, the logical and physical address conversion table is produced or updated in order to correspond to the current data writing. Here, a process is performed in which an entry that associates the logical address of the host data to be currently written with the physical address is added to the logical and physical address conversion table.

In addition, the logical and physical address conversion table is an example of the above-described management information, but the operation related to the logical and physical address conversion table will be collectively described later.

In succession, in step F103, the control unit 11 performs the data writing control according to the current writing request. Specifically, the host data which is temporarily stored in the buffer RAM 14 is stored in the non-volatile memory 15 according to the physical address subjected to the entry to the logical and physical address conversion table in the current step F102. For example, the writing is performed from the physical page PP having a low page address with respect to the physical block PB as described in FIG. 5A.

A determination of step F104 is performed if the host data writing is performed. Here, it is determined whether or not the physical page PP next to the last physical page on which the current host data writing is performed, that is, the physical page PP on which the writing is performed according to the next writing request is the lower page.

If the next physical page PP is the lower page, the process according to the current writing request is finished as it is.

On the other hand, if the next physical page is not the lower page, the process proceeds from step F104 to step F105, and the management information writing to the next physical page is performed.

The writing is performed as the management information, such as copyright information, an error table, or the logical and physical address conversion table. The writing may be performed partially or for all of these. In addition, the writing may be performed for the management information except for these.

Then, the determination of step F104 is performed again, if the next physical page PP is the lower page, the process is finished, and if the next physical page PP is not the lower page, the management information writing to further the next physical page PP is performed again in step F105.

The writing operation performed in such a process will be described with reference to FIGS. 7 to 9B.

Figure 7:
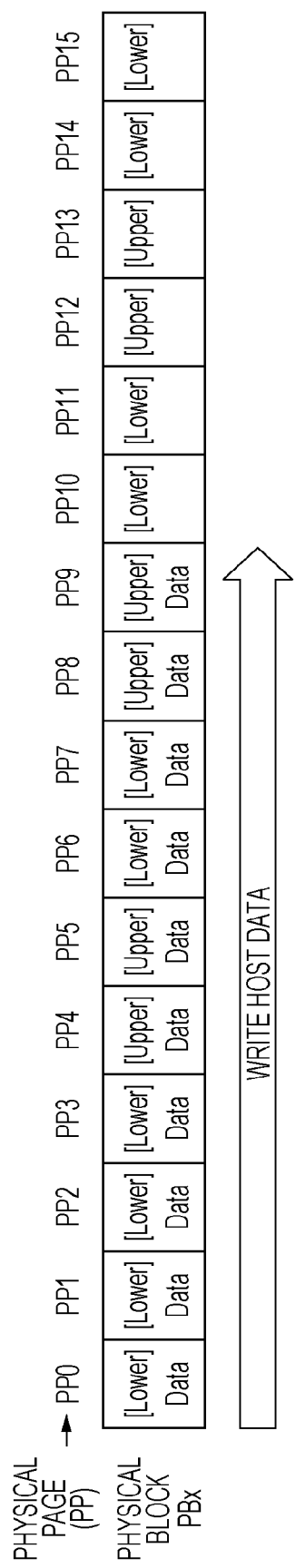
FIG. 7 is an explanatory diagram of an operation example when writing host data according to the embodiment.

FIGS. 7, 8A, and 9A illustrate states in which the current host data writing is performed with respect to a certain physical block PBx. In FIGS. 7 to 9B, the data within each physical page PP indicates the states in which the host data is written.

FIG. 7 illustrates a case where the current host data is written to the physical pages PP0 to PP9 based on the writing control of step F103. In this case, the next physical page PP10 becomes the lower page. Therefore, in step F104, the next physical page PP is considered as the lower page, and the process is finished according to the current writing request as it is.

FIG. 8A illustrates a case where the current host data is written to the physical pages PP0 to PP8 based on the writing control of step F103. In this case, the next physical page PP9 is the upper page. Therefore, in step F104, it is determined that the next physical page is not the lower page, and the management information MGT writing to the next physical page PP9 is performed in step F105 as illustrated in FIG. 8B. Then, in step F104, it is determined that the next physical page PP10 is the lower page, and thereby a series of processes are finished according to the current writing request.

FIG. 9A illustrates a case where the current host data is written to the physical pages PP0 to PP7, based on the writing control of step F103. In this case, the next physical page PP8 is the upper page. Therefore, it is determined that the next physical page is not the lower page in step F104. Thus, the management information MGT writing to the physical page PP8 is performed in step F105 as illustrated in FIG. 9B. However, even at this time, the next physical page PP9 is the upper page. Therefore, the process further proceeds from step F104 to step F105, and the management information MGT writing to even the next physical page PP9 is performed as illustrated in FIG. 8B.

Thereafter, in step F104, it is determined that the next physical page PP10 is the lower page, and thereby a series of processes is finished according to the current writing request.

As described above, in the data writing operation according to the present embodiment, when the host data writing is performed, certain data writing is performed until the physical page PP immediately before the lower page, so that the data writing according to the next data writing request may be started from the lower page.

That is, at the time of the writing completion of the host data, if the next physical page is the lower page, a series of the writing operation is finished at that time.

In addition, at the time of the writing completion of the host data, if the next physical page is not the lower page, the management information writing is performed until the next physical page is in the state of lower page, and a series of the writing operation is finished.

Therefore, when there is the writing request from the host apparatus 2, the host data writing is necessarily started from the lower page. Thereby high speed writing access is realized.

As the supplied host data from the host apparatus 2, there is large size data such as stream data or small size data such as 4 KB or 8 KB, which is written to a single physical page PP.

The physical page PP is used in the order of page addresses, and thus comparatively large size host data is written by being used in the order of physical addresses, regardless of the lower page/upper page. For example, FIGS. 7 to 9B illustrate the writing examples of the host data which uses approximately 10 physical pages, but at this time, both of the lower page/upper page are used for the host data writing in the order of the physical addresses as illustrated in FIGS. 7 to 9B.

In the lower page and the upper page, the pages having a large writing speed difference are first described, but in the case of the host data which averagely uses the lower page/upper page like this, the writing speed using the upper page is not a problem so much. The writing speed may be entirely averaged by using the lower page as well.

On the other hand, in the case of small size host data in which the writing is completed by a single physical page or the like, when the lower page and the upper page are used, the latter obviously decreases the speed.

However, in the case of the present embodiment, when there is the writing request, the writing is generally started from the lower page, and thus the writing is performed by using most of the lower page only for the small size host data. Therefore, particularly in an operation condition of the frequent writing requests for the small size host data, the access speed is extremely improved.

In addition, in the case of writing the large size host data, the writing is performed by including the upper page also, and thus it is possible to effectively use a capacity of the non-volatile memory 15 without wasting the upper page side.

Incidentally, the management information writing using step F105 may be performed after the control unit 11 performs the host data writing completion notification with respect to the host apparatus 2. In this manner, it is possible to improve the writing access speed of the host data from a viewpoint of the host apparatus 2, and to enable a high speed processing for an application of the host apparatus 2 side.

Figure 10:
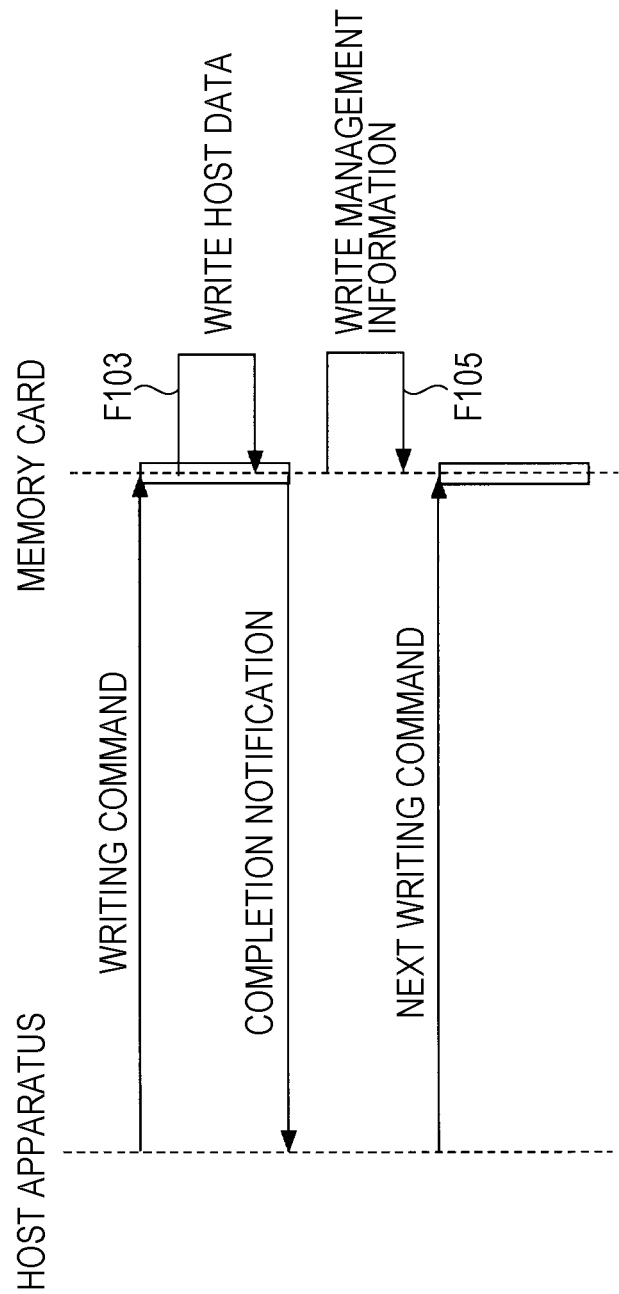
FIG. 10 is an explanatory diagram of a management information writing timing according to the embodiment of the present disclosure.

FIG. 10 illustrates a communication example between the host apparatus 2 and the memory card 1 (the control unit 11).

If the host apparatus 2 generates the writing command, the memory card 1 side performs the writing of the host data as illustrated in FIG. 10. That is, the control unit 11 performs the process of step F103 illustrated in FIG. 6. If the data writing is performed in step F103, the control unit 11 performs the completion notification with respect to the host apparatus 2 according to the completion.

Then immediately thereafter, in a case where the next page is the lower page, the management information writing is performed as the processing of step F105.

Accordingly, as it can be seen from FIG. 10, the management information writing is performed while there is no writing request from the host apparatus 2. As a result, the time which is to be used for the management information writing to the upper page is not included in the writing access time from the viewpoint of the host apparatus 2, and a speed-up access is realized from the viewpoint of the host apparatus 2.

Accordingly, when the next writing command is generated from the host apparatus 2, the host data writing is performed from the lower page.

In this manner, the control unit 11 notifies the host apparatus 2 of the writing completion with respect to the data writing request, and thereafter performs the management information writing until the physical page immediately before the lower page, if necessary, and the writing access time is effectively decreased from the viewpoint of the host apparatus 2.

4. Management Information Reading Process

As described above, when the host data is written, it is possible to write the management information to the upper page. Hereinafter, an operation example of a case where the control unit 11 reads out the management information will be described.

Figure 11:
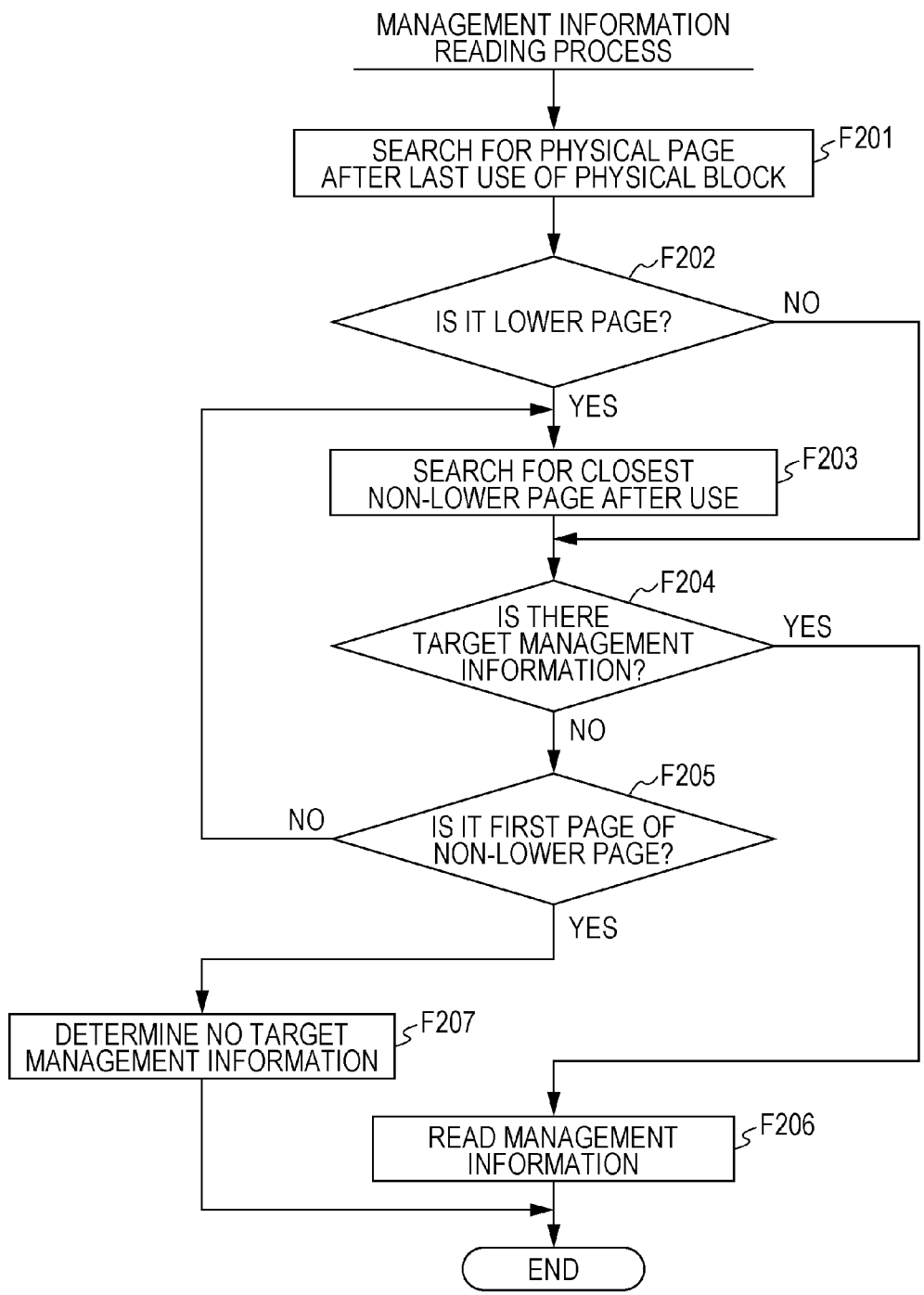
FIG. 11 is a flow chart of a management information reading process according to the embodiment.

An example of a management information reading process of the control unit 11 is illustrated in FIG. 11.

The control unit 11 can read the management information stored in the non-volatile memory 15 using the process illustrated in FIG. 11, if necessary.

In addition, here a process example of searching target management information only is illustrated. The logical and physical address conversion table is first described as one piece of the management information, but the process of a case where the logical and physical address conversion table is rebuilt will be described in detail later.

First, the control unit 11 performs a search for a finally used physical page PPe with regard to the physical block PBx of a management information reading object in step F201. For example, the finally used physical page PPe can be found by two minute search.

The physical block PB sequentially uses from the physical page PP0, and the finally used physical page PPe is the finally used physical page PPe in which the recent data writing was performed in the past at that time.

FIG. 12A illustrates the physical block PBx in which the data writing is performed until the physical page PP9 in the past, but in this case, the physical block PBx is written by sequentially using each physical page PP in the direction of arrows. Then the finally used physical page PPe becomes the physical page PP9.

For example, the two minute search is a method for finding the finally used physical page PPe while confirming a central physical page PP.

One piece of physical block PB is configured to have 16 pieces of physical pages PP0 to PP15, and for example, in FIG. 12A, the physical page PP7 is first confirmed. If the writing of the physical page PP7 is finished, the finally used physical page PPe becomes one of the physical pages PP7 to PP15. Thus, the next physical page PP11 is confirmed. If the physical page PP11 is not used, the finally used physical page PPe becomes one of the physical pages PP7 to PP10. Thus, the next physical page PP9 is confirmed. In this manner, the central physical pages PP are confirmed, and the finally used physical page PPe is found.

If the finally used physical page PPe is found out, the control unit 11 determines whether the finally used physical page PPe is the lower page or not, in step F202.

If it is not the lower page, the control unit 11 searches the closest non-lower page (that is, an upper page in a case of the MLC in a narrow sense) in step F203, tracing back to the lower page having the low physical address.

In step F204, the control unit 11 determines whether the target management information is stored in the non-lower page or not.

If the finally used physical page PPe which is searched in step F201 is the upper page, it is determined whether the target management information for the purpose of reading is stored in the finally used physical page PPe.

In addition, if the finally used physical page PPe which is searched in step F201 is the lower page, and the closest upper page is searched in step F203, it is determined whether the target management information for the purpose of reading is stored in the searched upper page.

In addition, the target management information here is a type of the management information which is to be read out in the current process. For example, if it is a process for the purpose of reading-out the copyright information stored as the management information, the target management information becomes the copyright information.

Then if the target management information exists, the process proceeds to step F206, the management information process is read from the related physical page, and the process is finished.

FIG. 12B illustrates a case where the finally used physical page PPe is the physical page PP9 which is the upper page. In this case, if the target management information MGT is stored in the finally used physical page PPe (PP9), that is read from the related physical page PP9 as illustrated in FIG. 12B.

FIG. 12C illustrates a case where the finally used physical page PPe is the physical page PP10 which is the lower page. In this case, the closest upper page to the finally used physical page PPe (PP10) is searched, and it is confirmed whether the target management information MGT exists in the physical page PP9 or not. Then if the target management information MGT is stored therein, that is read from the related physical page PP9 as illustrated in FIG. 12C.

On the other hand, when it is determined that the target management information is not stored in step F204, until it is determined to reach the non-lower page of the lowest physical address in step F205, the closest non-lower page is searched in a reverse order of step F203, and similarly it is determined whether the target management information exists or not. Then if the target management information is found, the management information is read in step F205.

In addition, a case where it is determined as the first physical page of the non-lower page in step F205, for example, according to the example of FIGS. 12A to 12C, is a case where even though the non-lower page is searched until the upper page (PP4) which is the lowest physical address, it is determined that the target management information is not stored.

In this case, the control unit 11 finishes the process, determining that there is no target management information in step F207.

In such a management information reading process, the latest management information is efficiently read out in a short time. For example, the management information includes various ones such as copyright information or error information in addition to the logical and physical address conversion table, but for example, in a case where the latest error information has to be read, if the process of FIG. 11 is performed on the error information as the target management information, the error information is efficiently read out.

That is, according to the above-described data writing process, both of the lower page and the upper page are used for the host data writing, but the non-lower page (the upper page only in the MLC) is used for the management information writing. Accordingly, the upper page only is searched from the finally used physical page PPe, and thus the latest management information can be quickly found. Even in a case where the logical and physical address conversion table which is stored in the most recent past is read simply at that time point, it may be a preferable process.

5. Application Example of Logical and Physical Address Conversion Table

In the above embodiment, the case where the logical and physical address conversion table is stored in the upper page as the management information is described.

The present embodiment allows that the host data in which the logical addresses are discontinuous is written to the continuous physical pages PP in the physical block PB.

As one of the general writing methods of the related art, there is a method which causes the logical addresses to be continuous in the host data to be written within the physical block PB. If it is done like this, in a case where the host data information written within the next physical block PB is to be obtained, the physical page PP finally used within the physical block PB is found, and the logical address information of the host data written to a redundant area of the physical page PP is read out, and thus it can be understood that any range of the host data of the logical address is stored in the related physical block PB. That is, if it is done so, the control unit 11 can briefly grasp a corresponding relationship between the logical address and physical address with regard to the related physical block PB.

However, in the case of this method, the host data written to the physical block PB generally uses continuous logical addresses, and thus, in a case where the host apparatus 2 attempts to write the host data of the discontinuous logical addresses, or in a case where the host data of a certain logical address has been written, the physical block PB may not be efficiently used. In this case, a so-called garbage collection frequently occurs which copies the host data from a certain physical block PBx to a separate physical block PBy, so that the logical address is in a continuous state within the physical block PB, and thereby a device durability and a writing speed are significantly decreased.

As another writing method, there is a method in which the host data having discontinuous logical addresses is allowed to be continuously written to the physical block PB.

In this case, even though the writing of non-sequential host data or rewriting of the host data of a certain logical address having finished the storage is desired, it is possible to correspond without performing the garbage collection. That is, the host data desired to be written may be written to the physical page PP next to the finally used physical page within the physical block PB.

However, in this case, in order to know the correspondence relationship between the logical address and the physical address of in the host data stored in a certain physical block PB, the control unit 11 reads out all the written physical page PP of the related physical block PB, obtains the logical address information written to the redundant area of each physical page PP, and thereby it is necessary to build the correspondence relationship information (that is, the logical and physical address conversion table). As a result, the writing speed and reading-out speed of the host data are significantly decreased.

The present embodiment adopts a method in which the host data having the discontinuous logical addresses are allowed to be continuously written to the physical block PB. Accordingly, it is possible to obtain the benefits of reducing the possibilities of the above garbage collection.

Moreover, when the host data is written, as described above, the management information (here, the logical and physical address conversion table) is written, if necessary, so that the next writing is started from the lower page, and thus it is possible to efficiently perform the operation for generating and updating the logical and physical address conversion table in a short time.

Therefore, the control unit 11 searches the physical block PB sequentially from the finally used physical page PPe toward the physical page PP of at the forefront for whether the logical and physical address conversion table is stored within the physical page or not, and performs a process which obtains the logical and physical address conversion table which is first found. Then, the logical and physical address conversion table is updated by using the obtained logical and physical address conversion table, and the logical address information of the physical page PP in which the logical and physical address conversion table is not stored.

Figure 13A:
FIGS. 13A and 13B are explanatory diagrams of a logical and physical address conversion table building process according to the embodiment.

FIGS. 13A and 14A illustrate examples of the logical and physical address conversion table.

FIG. 13A illustrates a storage state of each of physical pages PP0 to PP15 of a certain physical block PBx.

Temporarily, it is assumed that one sheet of physical page PP is configured to have 16 KB. In addition, the host data is assumed to be provided with a logical address in units of 4 KB. The number within a frame in FIG. 13A indicates the logical address (LBA). In addition, (L) indicates the lower page, and (U) indicates the upper page.

The example in FIG. 13A illustrates a view in which the host data of logical addresses of "1", "2", "3", and "4" is first written to the physical page PP0 according to the writing request at a certain time point, with respect to the physical block PB. At that time, the next physical page PP1 is the lower page, and thus the management information writing is not performed.

In the next writing request, the host data of the same logical addresses "1", "2", "3", and "4" is written to the physical page PP1. Even at this time, the next physical page PP2 is the lower page, and thus the management information writing is not performed.

Furthermore, in the next writing request, the host data of logical addresses "1000", "1001", "1002", and "1003" is written to the physical page PP2. Even at this time, the next physical page PP3 is the lower page, and thus the management information writing is not performed.

Furthermore, in the next writing request, the host data of logical addresses "3000" to "3011" is written to the physical page PP3 to PP5. But even at this time, the next physical page PP6 is the lower page, and thus the management information writing is not performed.

Thereafter, the host data of logical addresses "9", "10", "11", and "12" is written to the physical page PP6, the host data of logical addresses "100", "101", "102", and "103" is written to be updated to the physical page PP7, and the management information MGT is written to the physical pages PP8 and PP9.

The logical and physical address conversion table corresponding to the storage state of FIG. 13A is a table which associates the logical address (LBA) with the physical page PP, as illustrated in FIG. 14A, for example.

For example, it is illustrated that the latest host data of the logical addresses "1", "2", "3", and "4" beginning with the logical address "1" is stored in the physical page PP1.

In addition, it is shown that the latest host data of the logical addresses "9", "10", "11", and "12" started from the logical address "9" is stored in the physical page PP6.

Similarly, it is illustrated that the latest host data of each logical address is stored in the physical page PP.

In this manner, information showing the correspondence relationship between each physical page PP and the logical addresses of the host data stored in the physical page PP is stored in the logical and physical address conversion table.

Such a logical and physical address conversion table is built, and thus the control unit 11 can grasp that the host data designated by the host apparatus 2 using the logical address is stored in any logical page PP of the physical block PBx.

For description, each of corresponding information subjected to the entry to the logical and physical address conversion table is referred to as "logical-physical correspondence data".

In addition, the logical and physical address conversion table may be further associated with the number of the physical block PB, as illustrated in FIG. 14B.

In a case where the next physical page PP in which the storage of the host data is completed is not the lower page the management information MGT is stored, and thus the logical and physical address conversion table of a certain physical block PBx is not necessarily stored within the physical block PBx. Therefore, for example, the logical and physical address conversion table of the physical block PBx may be allowed to be written taking an opportunity of the management information writing within the physical page PP of other physical block PBy. Considering such a case, it is preferable to manage the numbers of the physical block PB and the numbers of the physical page PP in correspondence to each logical address, as illustrated in FIG. 14B.

In this manner, in a case where the logical and physical address conversion table is written to the physical page PP as the management information, the control unit 11 can acquire the latest logical and physical address conversion table as below, when necessary.

Figure 15:
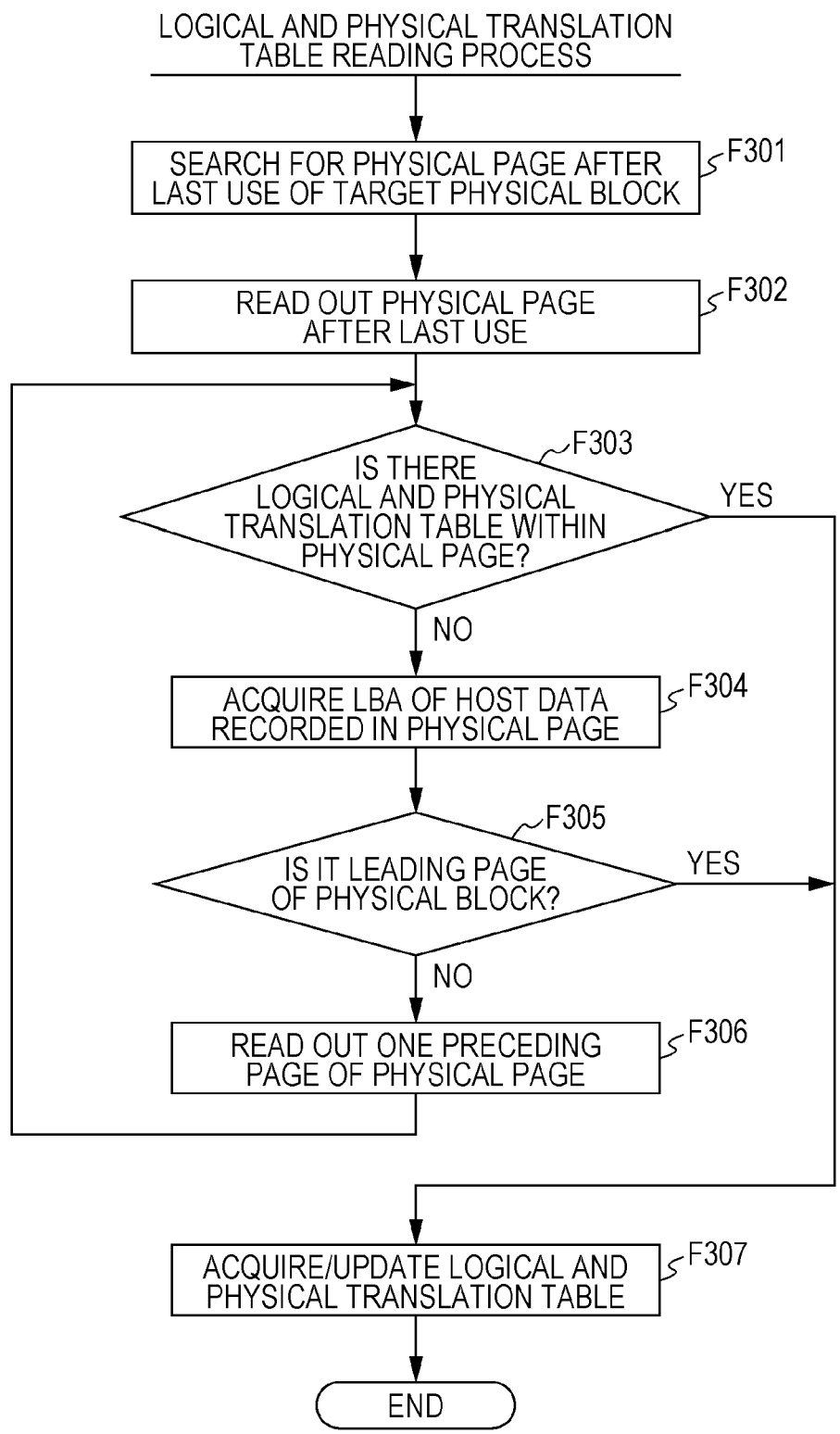
FIG. 15 is a flow chart of a logical and physical address conversion table reading process according to the embodiment.

FIG. 15 illustrates a writing process of the logical and physical address conversion table using the control unit 11. The control unit 11 can perform the writing process of the logical and physical address conversion table when a power is supplied, when a processing preparation of step F102 illustrated in FIG. 6 is performed, or at any other time.

First in step F301, the control unit 11 performs a search for the finally used physical page with regard to the physical block PBx of the object for which the logical and physical address conversion table is to be built. For example, the finally used physical page PPe is found by the two minute search. In the case of FIG. 13A, the finally used physical page PPe becomes the physical page PP9.

If the finally used physical page PPe is found, the control unit 11 performs reading-out of the finally used physical page PPe, and confirms the data content which is stored, in step F302. In particular, the control unit 11 confirms whether the logical and physical address conversion table is included in the finally used physical page PPe or not.

In a case where the logical and physical address conversion table is stored in the finally used physical page PPe, the control unit 11 proceeds from step F303 to step F307, and incorporates the logical and physical address conversion table.

For example, in the case of FIG. 13A, the finally used physical page PPe is the physical page PP9, but it is assumed that the logical and physical address conversion table is stored as the management data MGT.

In such a case, the control unit 11 incorporates the logical and physical address conversion table stored in the finally used physical page PPe which has been searched, as illustrated by an arrow R in FIG. 13A.

The logical and physical address conversion table stored in the finally used physical page PPe is the latest one which includes the logical-physical correspondence data with regard to all the whole host data stored in the related physical block PBx at that time.

For example, when the data is written, in step F102 in FIG. 6, the logical-physical correspondence data is generated with regard to the host data to be written from this time, and subjected to the entry to the logical and physical address conversion table. Whenever the data is written, the process of step F102 in FIG. 6 is performed, and for example, when the logical addresses of "100", "101", "102", and "103" are written to the physical page PP7 in FIG. 13A, the logical and physical address conversion table updated by the control unit 11 in step F102 becomes that illustrated in FIG. 14A. Accordingly, the logical and physical address conversion table written to the physical pages PP8 and PP9 is in the latest state where the logical-physical correspondence data is subjected to the entry up to the physical page PP7.

That is, in a case where the logical and physical address conversion table is read from the finally used physical page PPe in this manner, the latest logical and physical address conversion table is obtained.

On the other hand, in a case where the latest logical and physical address conversion table is not included in the finally used physical page PPe, the control unit 11 proceeds from step F303 to step F304, confirms and stores the logical address LBA of the host data stored in the physical page PP (in this case, the finally used physical page PPe).

Then if the related physical page PP is not the first physical page PP0 of the object physical block PBx, the process proceeds from step F305 to step F306, one preceding page of the physical page PP is read out, and in step F303 it is confirmed whether or not the logical and physical address conversion table is stored in the physical page PP.

If the logical and physical address conversion table is not stored in the physical page PP, in addition, in step F304 the control unit 11 confirms and stores the logical address LBA of the host data stored in the physical page PP. Then if the related physical page PP is not the first physical page PP0 of the object physical block PBx of the object, the process proceeds from step F305 to step F306, furthermore one preceding page of the physical page PP is read out, and in step F303 it is confirmed whether or not the logical and physical address conversion table is stored in the physical page PP.

That is, in the process of steps F304→F305→F306→F303 the previous physical page PP is sequentially pulled out from the finally used physical page PPe, and the process of searching for the physical page PP stored in the logical and physical address conversion table is performed, while the logical address of the host data of each physical page PP is stored.

In this process, if it is confirmed that the logical and physical address conversion table exists in a certain physical page PP, the control unit 11 proceeds from step F303 to step F307, and incorporates the logical and physical address conversion table from the physical page PP. Then in this case, the incorporated logical and physical address conversion table is updated to the latest state.

Figure 13B:
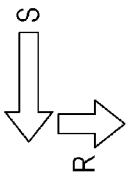

For example, in FIG. 13B, the finally used physical page PPe equals the physical page PP10, and the case where the logical and physical address conversion table does not exists in the physical page PP10 is illustrated.

In this case, as illustrated by an arrow S, the one preceding page of the physical page PP is confirmed. In this example, if the logical and physical address conversion table is included in the management information MGT stored in one preceding page PP9 of the physical page, the logical and physical address conversion table is incorporated from the physical page PP9 as illustrated by the arrow R.

In this manner, the logical and physical address conversion table stored in the physical page PP except for the finally used physical page PPe does not include the logical-physical correspondence data with regard to all the host data stored in the related physical block PB at that time. For example, in the example of FIG. 13B, the incorporated logical and physical address conversion table does not include the logical-physical correspondence data with regard to the physical page PP10.

Therefore, in step F307, the logical and physical address conversion table is updated so that the logical-physical correspondence data with regard to the physical page PP10 may be reflected in the logical and physical address conversion table.

In this manner, the logical and physical address conversion table in the latest state is obtained. In this case, the latest logical and physical address conversion table is as one illustrated in FIG. 14C, in which the logical-physical correspondence data that associates the physical page PP10 with the logical addresses "5", "6", "7", and "8" is added to the content of FIG. 14A.

In addition, in step F305, a case where it is determined to be the leading physical page PP0 represents a case where the logical and physical address conversion table is stored in all the physical pages PP of the physical block PBx.

In this case, the control unit 11 newly builds the logical and physical address conversion table in step F307.

That is, the logical-physical correspondence data is generated with regard to each logical address, and the logical and physical address conversion table is generated, by using the logical address stored in step F304 with regard to each physical page PP from the finally used physical page PPe to the leading physical page PP0. Accordingly, the logical and physical address conversion table in the latest state is obtained.

For example, in a case where the power is supplied, or it is necessary to obtain the logical and physical address conversion table for the data writing preparation or the like, the logical and physical address conversion table may be obtained as described above.

In particular, in a case where the logical and physical address conversion table is found from the finally used physical page PPe, the logical and physical address conversion table may be simply read. In addition, if the logical and physical address conversion table is found in the physical page PP traced back from the finally used physical page PPe, it may be updated so that the content of each physical page PP until then is reflected in the read logical and physical address conversion table.

That is, in the present embodiment, the logical and physical address conversion table is written as one of the management information MGT, and thus the latest logical and physical address conversion table is obtained. Accordingly, without a situation where all the physical pages have to be searched, an advantage is obtained in that there are increasing cases where the latest logical and physical address conversion table can be quickly obtained.

In particular, in a case where much writing of the host data with a small size is necessary as the writing request from the host apparatus 2, there is a high possibility that the logical and physical address conversion table may be written to the upper page. In this case, it is advantageous in quickly reading out the latest logical and physical address conversion table.

In addition, in a case where the above-described process of FIG. 6 is performed according to the writing request, in step F102 the update reflecting the content of the host data to be written this time may be performed in the latest logical and physical address conversion table obtained as described above. Accordingly, what the logical and physical address conversion table is stored as the management information is effective to improve the efficiency in the data writing process.

In addition, if the logical and physical address conversion table is written to the physical page PP, and the latest logical and physical address conversion table is built by reading it out as described above, it is also possible to perform an efficient recovery from an abnormal situation such as sudden power disconnection, and to enhance the data reliability.

6. Modification Example

Hitherto, the embodiments are described, but various modification examples may be considered as the configuration and the process of the embodiments.

In the embodiments, the case of the MLC (narrow sense) is mainly described, but the present disclosure can be applied to even the case of the TLC as illustrated in FIG. 5B. In this case, in the determination of step F104 in FIG. 6, "it is not the lower page" means that it may be the upper page or the middle page. That is, if the next physical page is the middle page or the upper page, the management information writing may be performed in step F105.

In addition, the non-lower page in steps F203 and F205 in FIG. 11 may be either the upper page or the middle page.

That is, in the case of TLC, the writing speed on the middle page and the upper page is slow compared to the lower page, and thus the middle page and the upper page are used in the management information writing.

In addition, in the present embodiment, the control unit 11 performs the management information writing until the physical page immediately before the lower page, so that the data writing according to the next data writing request is started from the lower page, but it may not necessarily be the management information.

For example, dummy data, random data, data which is not generally referenced directly from the host apparatus 2, or the like may be written to the upper page or the middle page. That is, the writing of the non-host data may be performed. In that sense, in step F105 in FIG. 6, the writing of various information or meaningless data may be performed as the non-host data.

In addition, in the present embodiment, the example of the memory card 1 is used, but the present application may be applied to a case where the non-volatile memory 15 and the control unit 11 are separately configured.

The technology of the present disclosure may be applied to various memory cards, an SSD, an eMMC or the like.

In addition, the present application can be applied to the following configurations.

(1) A control device including a control unit that performs a writing control of supplied host data, according to a data writing request from a host apparatus, with respect to a non-volatile memory where multi-value storage with 2 bits or more is performed in one memory cell, having a lower level page and an upper level page for at least the multi-value storage as a physical page in which a physical address is set, and where data writing is performed using each physical page in an order of physical addresses, and that causes the data writing to be performed until the physical page immediately before the lower level page, such that the data writing according to a next data writing request is started from the lower level page.

(2) The control device described in the above (1), wherein the control unit causes a non-host data writing to be performed until the physical page immediately before the lower level page, when host data writing according to the data writing request is compeleted without reaching the physical page immediately before the lower level page.

(3) The control device described in the above (1) or (2), wherein the control unit causes a non-host data writing to be performed until the physical page immediately before the lower level page, after writing completion with respect to the data writing request is notified to the host apparatus, when host data writing according to the data writing request is completed without reaching the physical page immediately before the lower level page.

(4) The control device described in the above (2) or (3), wherein the non-host data is management information used by the control unit.

(5) The control device described in the above (4), wherein the control unit performs a control that reads the management information by searching for the physical page except for the lower level page, with respect to the non-volatile memory.

(6) The control device described in the above (2) to (5), wherein the non-host data is a logical and physical address conversion table showing a correspondence between a logical address of the host data and the physical address on the non-volatile memory.

(7) The control device described in the above (6), wherein a physical block is formed in the non-volatile memory by a plurality of physical pages, wherein the control unit performs a process to obtain the logical and physical address conversion table first found by searching the physical block sequentially from the finally used physical page toward the physical page at the forefront for whether the logical and physical address conversion table is stored within the physical page or not, and wherein the control unit obtains the newest logical and the latest physical address conversion table by using the obtained physical address conversion table and logical address information of the physical page in which the logical and physical address conversion table is not stored.

(8) The control device described in the above (1) to (7), wherein the non-volatile memory is a multi-value NAND type flash memory.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A control device comprising:
one or more processors configured to:
perform a writing control of supplied host data, according to a data writing request from a host apparatus, with respect to a non-volatile memory where multi-value storage with 2 bits or more is performed in a memory cell, wherein the memory cell comprises a lower level page and an upper level page for at least the multi-value storage as a physical page in which a physical address is set, and data writing is performed using each physical page in an order of physical addresses; and cause the data writing to be performed until the next physical page is determined to be the lower level page, such that the data writing according to a next data writing request is started from the lower level page.

2. The control device according to claim 1,
wherein the one or more processors are configured to cause a non-host data writing to be performed until the next physical page is the lower level page, in an event host data writing according to the data writing request is completed without reaching the physical page immediately before the lower level page.

3. The control device according to claim 2,
wherein the non-host data is management information used by the one or more processors.

4. The control device according to claim 3,
wherein the one or more processors are configured to perform a control that reads the management information by searching for the physical page except for the lower level page, with respect to the non-volatile memory.

5. The control device according to claim 2,
wherein the non-host data is a logical and physical address conversion table showing a correspondence between a logical address of the host data and the physical address on the non-volatile memory.

6. The control device according to claim 5,
wherein a physical block is formed in the non-volatile memory by a plurality of physical pages,
wherein the one or more processors are configured to perform a process to obtain the logical and physical address conversion table by searching the physical block sequentially from the finally used physical page toward the physical page at the forefront for whether the logical and physical address conversion table is stored within the physical page or not, and
wherein the one or more processors are configured to obtain the newest logical and physical address conversion table by using the obtained logical and physical address conversion table and logical address information of the physical page in which the logical and physical address conversion table is not stored.

7. The control device according to claim 1,
wherein the one or more processors are configured to control unit cause a non-host data writing to be performed until the next physical page is the lower level page, after writing completion with respect to the data writing request is notified to the host apparatus, in an event host data writing according to the data writing request is completed without reaching the physical page immediately before the lower level page.

8. The control device according to claim 1, wherein the non-volatile memory is a multi-value NAND type flash memory.

9. The control device according to claim 1, wherein the one or more processors are configured to end a process of the data writing according to the data writing request in case the next physical page is determined to be the lower level page in an event host data writing according to the data writing request has completed.

10. The control device according to claim 1, wherein, in an event it is determined that the next physical page is the upper level page, management information is written to the next physical page.

11. The control device according to claim 10, wherein the management information comprises one of: copyright information, error information showing the physical address with error occurred in the non-volatile memory, production information of the non-volatile memory, information on a serial number, and usage history information.

12. A storage device comprising:
  a non-volatile memory where multi-value storage with 2 bits or more is performed in a memory cell, wherein the memory cell comprises a lower level page and an upper level page for at least the multi-value storage as a physical page in which a physical address is set, and data writing is performed by using each physical page in an order of physical addresses; and
  a control unit configured to:
    perform a writing control of supplied host data, according to a data writing request from a host apparatus, with respect to the non-volatile memory, and
    cause the non-volatile memory to perform data writing until the next physical page is determined to be the lower level page, such that the data writing corresponding to a next data writing request is started from the lower level page.

13. A data writing method with respect to a non-volatile memory where multi-value storage with 2 bits or more is performed in a memory cell, the memory cell comprising a lower level page and an upper level page for at least the multi-value storage as a physical page in which a physical address is set, and data writing is performed using each physical page in an order of physical addresses, the method comprising:
  performing a writing of supplied host data, according to a data writing request from a host apparatus, with respect to the non-volatile memory; and
  causing data writing to be performed until the next physical page is determined to be the lower level page, such that the data writing according to a next data writing request is started from the lower level page.

* * * * *